United States Patent
Tashiro

(10) Patent No.: US 10,862,174 B2
(45) Date of Patent: Dec. 8, 2020

(54) SECONDARY BATTERY SYSTEM AND METHOD OF ESTIMATING DETERIORATION STATE OF SECONDARY BATTERY SYSTEM

(71) Applicant: TOYOTA JIDOSHA KABUSHIKI KAISHA, Toyota (JP)

(72) Inventor: Hiroki Tashiro, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 77 days.

(21) Appl. No.: 16/238,008

(22) Filed: Jan. 2, 2019

(65) Prior Publication Data

US 2019/0237819 A1     Aug. 1, 2019

(30) Foreign Application Priority Data

Jan. 30, 2018    (JP) .................................. 2018-013704

(51) Int. Cl.
    *G01R 31/389*      (2019.01)
    *H01M 10/42*      (2006.01)
    (Continued)

(52) U.S. Cl.
    CPC ......... *H01M 10/4257* (2013.01); *B60L 50/51* (2019.02); *B60L 58/10* (2019.02);
    (Continued)

(58) Field of Classification Search
    CPC .. G01R 31/389; G01R 31/392; G01R 31/367; G01R 31/3842; G01R 31/374;
    (Continued)

(56) References Cited

U.S. PATENT DOCUMENTS 6,160,380 A * 12/2000 Tsuji .................. G01R 31/3648
                                                                                                                320/132
7,202,632 B2 * 4/2007 Namba ................ G01R 31/367
                                                                                                                320/132

(Continued)

FOREIGN PATENT DOCUMENTS

JP      09-121471 A      5/1997
JP      09-121472 A      5/1997

(Continued)

*Primary Examiner* — Vinh P Nguyen
(74) *Attorney, Agent, or Firm* — Sughrue Mion, PLLC

(57) ABSTRACT

A secondary battery system includes a secondary battery, an electric circuit, and an electronic control unit. The electronic control unit is configured to execute first calculation control, second calculation control, and estimation control when a predetermined condition is satisfied. The first calculation control is control for calculating a first impedance of the secondary battery based on a voltage value of the secondary battery at a time when a current value of the secondary battery is fluctuated on a first cycle. The second calculation control is control for calculating a second impedance of the secondary battery based on the voltage value of the secondary battery at a time when the current value of the secondary battery is fluctuated on a second cycle. The estimation control is control for estimating a reaction resistance of the secondary battery from a difference between the first impedance and the second impedance.

6 Claims, 9 Drawing Sheets

(51) Int. Cl.
*H01M 10/48* (2006.01)
*B60L 58/10* (2019.01)
*B60L 50/51* (2019.01)
*G01R 31/392* (2019.01)

(52) U.S. Cl.
CPC ......... *G01R 31/389* (2019.01); *G01R 31/392* (2019.01); *H01M 10/48* (2013.01); *B60L 2210/40* (2013.01); *H01M 2010/4271* (2013.01); *H01M 2010/4278* (2013.01); *H01M 2220/20* (2013.01)

(58) Field of Classification Search
CPC ................ G01R 31/3648; G01R 31/36; G01R 31/3828; G01R 31/396; G01R 19/16542; G01R 31/3647; G01R 31/387; G01R 31/50; G01R 31/52; G01R 31/007; G01R 31/371; G01R 31/382; G01R 31/388; G01R /; H01M 10/486; H01M 10/4257; H01M 2010/4271; H01M 10/42; H01M 2010/4278; H01M 10/44; H01M 10/056; H01M 10/425; H01M 10/617; H01M 10/625; H01M 10/633; H01M 4/485; H01M 10/465; H01M 2220/20; H01M 10/48; H02J 7/0021; H02J 7/00; H02J 7/0047; H02J 7/007; H02J 7/1461; H02J 7/0024; H02J 7/0031; H02J 7/0069; H02J 7/04; B60L 58/12; B60L 2210/40; B60L 50/51; B60L 58/10; B60L 1/00; B60L 2240/545; B60L 2240/547; B60L 2240/549; B60L 2260/44; B60L 7/16; B60L 3/0046; B60L 3/12; B60L 58/13; B60L 58/14; B60L 58/16; B60L 58/21; B60K 6/28; B60Y 2200/91; B60Y 2200/92

See application file for complete search history.

(56) References Cited

U.S. PATENT DOCUMENTS

| | | | |
|---|---|---|---|
| 10,054,645 | B2* | 8/2018 | Kobayashi ............ H01M 10/04 |
| 2011/0133744 | A1 | 6/2011 | Ono et al. |
| 2017/0184677 | A1 | 6/2017 | Noda et al. |
| 2017/0187215 | A1 | 6/2017 | Noda et al. |
| 2019/0064282 | A1* | 2/2019 | Haga ..................... B60L 58/12 |
| 2019/0162796 | A1* | 5/2019 | Soejima ............ G01R 31/3842 |

FOREIGN PATENT DOCUMENTS

| | | |
|---|---|---|
| JP | 2002-101571 A | 4/2002 |
| JP | 2009-128194 A | 6/2009 |
| JP | 2011-122835 A | 6/2011 |
| JP | 2011-185619 A | 9/2011 |
| JP | 2016-039742 A | 3/2016 |
| JP | 2016-057264 A | 4/2016 |
| JP | 2016-063622 A | 4/2016 |
| JP | 2017-174587 A | 9/2017 |

* cited by examiner

LONG-CYCLE IMPEDANCE ZL

SHORT-CYCLE IMPEDANCE ZS

DIFFERENCE ΔZ = ZL−ZS

SECONDARY BATTERY SYSTEM AND METHOD OF ESTIMATING DETERIORATION STATE OF SECONDARY BATTERY SYSTEM

INCORPORATION BY REFERENCE

The disclosure of Japanese Patent Application No. 2018-013704 filed on Jan. 30, 2018 including the specification, drawings and abstract is incorporated herein by reference in its entirety.

BACKGROUND

1. Technical Field

The present disclosure relates to a secondary battery system and a method of estimating a deterioration state of the secondary battery system, and more specifically, to an art for estimating a reaction resistance of the secondary battery.

2. Description of Related Art

In recent years, the diffusion of vehicles mounted with secondary batteries for running has been in progress. The secondary batteries mounted in these vehicles can deteriorate as they are used or as time elapses, so there are demands to estimate a deterioration state of each of the secondary batteries. Thus, there is proposed a method of estimating a deterioration state of a secondary battery based on an impedance (an internal resistance) of the secondary battery.

A storage battery evaluation device disclosed in, for example, Japanese Patent Application Publication No. 2011-185619 (JP 2011-185619 A) is equipped with current detection means for detecting a current flowing into a storage battery, pulsation rate computation means, and storage means. The pulsation rate computation means separates a value of the current detected by the current detection means into a ripple part and a DC part for each of a plurality of frequencies, and calculates a pulsation rate as a ratio of each ripple part to each DC part as to each ripple part for each of the plurality of the frequencies. Data (pulsation rate-internal resistance corresponding data) that associate the pulsation rate with the impedance of the storage battery for each of the plurality of the frequencies are stored in the storage means. In this storage battery evaluation device, the impedance of the storage battery is estimated from the pulsation rate calculated by the pulsation rate computation means, by referring to the data.

SUMMARY

Although the details will be described later, the current value of the secondary battery is fluctuated with different frequencies (a long cycle and a short cycle), and a voltage value of the secondary battery at that time is detected. Furthermore, an impedance on the long cycle is calculated from a relationship between the current value and voltage value of the secondary battery on the long cycle, and an impedance on the short cycle is calculated from a relationship between the current value and voltage value of the secondary battery on the short cycle. Then, when a difference between the impedance on the long cycle and the impedance on the short cycle is obtained, this difference is equivalent to a reaction resistance of the secondary battery. The reaction resistance can be carved up from the other impedance components (a DC resistance and a diffusion resistance) according to this method.

The reaction resistance of the secondary battery corresponds to a deterioration mode resulting from the formation of a coat on the surface of an active material of the secondary battery. The description with reference to a concrete example will follow. For example, in a lithium-ion secondary battery, there is known a deterioration as the deposition of lithium metal on the surface of a negative electrode (so-called lithium deposition). Therefore, the degree of progress of the deposition of lithium (or the degree of change in tolerability of the secondary battery against the deposition of lithium) can be accurately estimated by estimating the reaction resistance of the lithium-ion secondary battery with high accuracy.

The inventors have focused attention on the fact that the reaction resistance cannot be accurately carved up from the other impedance components in accordance with the cycle of the current value when a predetermined condition (which will be described later) is satisfied in obtaining the reaction resistance as described previously, and that the accuracy in estimating the reaction resistance can fall. When the accuracy in estimating the reaction resistance falls, it may also become impossible to estimate the deterioration mode corresponding to the reaction resistance with high accuracy. That is, the accuracy in estimating the deterioration state of the secondary battery may fall.

The present disclosure enhances the accuracy in estimating a deterioration state of a secondary battery, in a secondary battery system or a method of estimating a deterioration state of the secondary battery system.

A first aspect of the disclosure is a secondary battery system. The secondary battery system includes a secondary battery, an electric circuit, and an electronic control unit. The secondary battery includes an electrode. The electrode includes an active material and is impregnated with an electrolytic solution. The electric circuit includes at least one of an electric power supply circuit that is configured to supply an electric power to the secondary battery, and a load circuit that is configured to consume the electric power of the secondary battery. The electronic control unit is configured to control a input current input to the secondary battery and an output current output from the secondary battery by controlling the electric circuit. The electronic control unit is configured to execute first calculation control, second calculation control, and estimation control when a predetermined condition including a first condition and a second condition is satisfied. The first calculation control is control for calculating a first impedance of the secondary battery based on a voltage value of the secondary battery at a time when a current value of the secondary battery is fluctuated on a first cycle. The second calculation control is control for calculating a second impedance of the secondary battery based on the voltage value of the secondary battery at a time when the current value of the secondary battery is fluctuated on a second cycle that is shorter than the first cycle. The estimation control is control for estimating a reaction resistance of the secondary battery from a difference between the first impedance and the second impedance. The reaction resistance is an impedance component that is associated with exchange of an electric charge on an interface between the electrolytic solution and the active material. The first condition is a condition that a difference between an average current difference of the secondary battery and a first target difference determined in advance is smaller than a first reference value when the current is fluctuated on the first cycle. The second condition is a condition that a difference between the average current difference of the secondary battery and a second target difference determined in advance is smaller than a second reference value when the current is fluctuated on the second cycle. The average current difference is a difference between an average current value of the secondary battery within a predetermined period and an average current value of the secondary battery within a period subsequent to the predetermined period.

When the first condition is not satisfied, the environment of the secondary battery system (e.g., a running situation of a vehicle in the case where the secondary battery system is mounted in the vehicle) may have changed at the time of fluctuations in current on the first cycle. By the same token, when the second condition is not satisfied, the environment of the secondary battery system may have changed at the time of fluctuations in current on the second cycle. In this case, the first impedance and the second impedance have not been calculated under the same condition, so the accuracy in estimating the reaction resistance may also become low. In contrast, with this configuration, the reaction resistance of the secondary battery is estimated when both the first condition and the second condition are satisfied. Therefore, the deterioration mode resulting from the formation of the coat on the surface of the active material of the secondary battery can also be estimated with high accuracy, through the use of the reaction resistance estimated with high accuracy. That is, the accuracy in estimating the deterioration state of the secondary battery can be enhanced.

In the secondary battery system, the predetermined condition may further include a third condition and a fourth condition. The third condition may be a condition that a fluctuation width of the current value of the secondary battery on the first cycle is smaller than a third reference value. The fourth condition may be a condition that the fluctuation width of the current value of the secondary battery on the second cycle is smaller than a fourth reference value.

When at least one of the third condition and the fourth condition is not satisfied, an intended current pattern may not have been generated due to various factors such as disturbance noise from the outside and the like. In contrast, with this configuration, the reaction resistance of the secondary battery is estimated when the first to fourth conditions are all satisfied. Therefore, the deterioration mode resulting from the formation of the coat on the surface of the active material of the secondary battery can also be estimated with high accuracy, through the use of the reaction resistance estimated with high accuracy.

In the secondary battery system, the predetermined condition may further include a fifth condition. The fifth condition may be a condition that the fluctuation width of the current value of the secondary battery before fluctuation of the current value of the secondary battery on either the first cycle or the second cycle is smaller than a fifth reference value.

When the fluctuation width of the current value before fluctuating the current value is larger than the fifth reference value, namely, when a ripple has already been superimposed on the current, the accuracy in estimating the reaction resistance can become low due to the influence of this ripple (the unintended ripple). With this configuration, the reaction resistance is estimated when the fluctuation width of the current value of the secondary battery before fluctuation is smaller than the fourth reference value and no ripple has been superimposed on the current. Thus, the accuracy in estimating the reaction resistance can be further enhanced, so the accuracy in estimating the deterioration state of the secondary battery can be further enhanced.

In the secondary battery system, the secondary battery, the electric circuit, and the electronic control unit may be mounted on a vehicle. The electric power supply circuit may include a charging device that is configured to charge the secondary battery with the electric power supplied from outside the vehicle.

In the secondary battery system, the secondary battery, the electric circuit, and the electronic control unit may be mounted on a vehicle. The load circuit may include at least one of a drive device that is configured to drive a motor-generator of the vehicle, and an air-conditioning device that is configured to execute air-conditioning of a vehicle interior of the vehicle.

A second aspect of the disclosure is a method of estimating a deterioration state of a secondary battery system. The secondary battery system includes a secondary battery and an electronic control unit that is configured to control an input current input to the secondary battery and an output current output from the secondary battery. The method of estimating the deterioration state includes executing, by the electronic control unit, a first calculation step, a second calculation step, and an estimation step when a predetermined condition including a first condition and a second condition is satisfied. The first calculation step is a step of calculating a first impedance of the secondary battery based on a voltage value of the secondary battery at a time when a current value of the secondary battery is fluctuated on a first cycle. The second calculation step is a step of calculating a second impedance of the secondary battery based on the voltage value of the secondary battery at a time when the current value of the secondary battery is fluctuated on a second cycle that is shorter than the first cycle. The estimation step is a step of estimating a reaction resistance of the secondary battery from a difference between the first impedance and the second impedance. The reaction resistance is an impedance component that is associated with exchange of an electric charge on an interface between an electrolytic solution and an active material of the secondary battery. The first condition is a condition that a difference between an average current difference of the secondary battery and a first target difference determined in advance is smaller than a first reference value when the current is fluctuated on the first cycle. The second condition is a condition that a difference between the average current difference of the secondary battery and a second target difference determined in advance is smaller than a second reference value when the current is fluctuated on the second cycle. The average current difference is a difference between an average current value of the secondary battery within a predetermined period and an average current value of the secondary battery within a period subsequent to the predetermined period.

With this configuration, the reaction resistance of the secondary battery is estimated when both the first condition and the second condition are satisfied. Therefore, the deterioration mode resulting from the formation of the coat on the surface of the active material of the secondary battery can also be estimated with high accuracy, through the use of the reaction resistance estimated with high accuracy. That is, the accuracy in estimating the deterioration state of the secondary battery can be enhanced.

With the present disclosure, the accuracy in estimating the deterioration state of the secondary battery can be enhanced in the secondary battery system or the method of estimating the deterioration state of the secondary battery system.

BRIEF DESCRIPTION OF THE DRAWINGS

Features, advantages, and technical and industrial significance of an exemplary embodiment of the disclosure will be described below with reference to the accompanying drawings, in which like numerals denote like elements, and wherein.

DETAILED DESCRIPTION OF EMBODIMENT

The embodiment of the present disclosure will be described hereinafter in detail with reference to the drawings. Incidentally, like or equivalent components are denoted by like reference symbols, and description thereof will not be repeated.

Incidentally, a configuration in which a vehicle 1 is mounted with a secondary battery system 2 according to the present embodiment will be described hereinafter as an example. However, "the secondary battery system 2" according to the present disclosure may not necessarily be used for a vehicle, but may be, for example, stationary.

Figure 1:
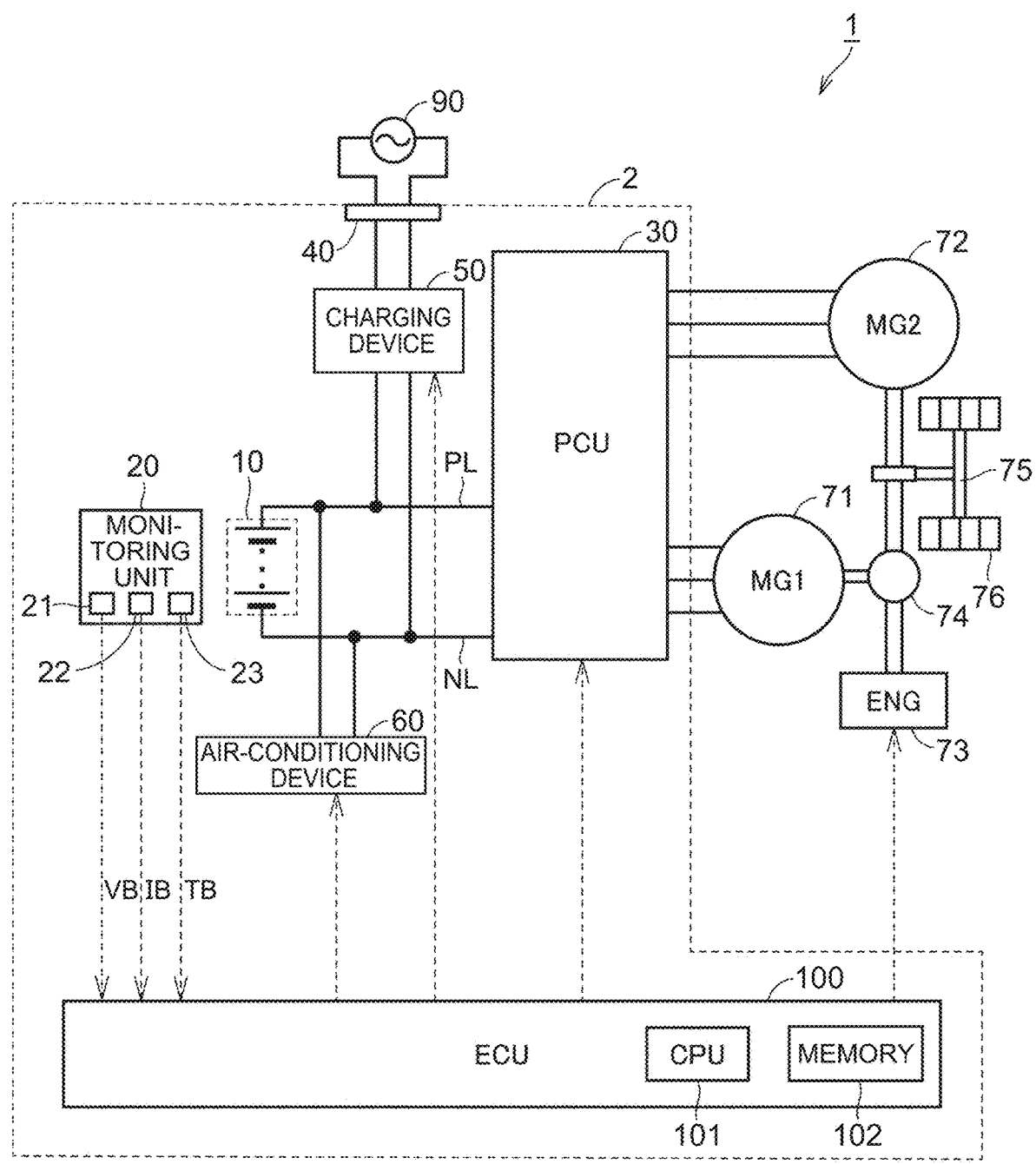
FIG. 1 is a view schematically showing the overall configuration of a vehicle mounted with a secondary battery system according to the present embodiment.

FIG. 1 is a view schematically showing the overall configuration of the vehicle 1 mounted with the secondary battery system 2 according to the present embodiment. Referring to FIG. 1, the vehicle 1 in the present embodiment is a plug-in hybrid vehicle. However, the vehicle that can be mounted with "the secondary battery system 2" according to the present disclosure may not necessarily be a plug-in hybrid vehicle. All kinds of vehicles can be mounted with "the secondary battery system 2" according to the present disclosure. Therefore, the vehicle 1 may be an electric vehicle or a fuel-cell-powered vehicle.

The vehicle 1 is equipped with the secondary battery system 2. The secondary battery system 2 is equipped with a battery 10, a monitoring unit 20, a power control unit (a PCU) 30, an inlet 40, a charging device 50, an air-conditioning device 60, and an electronic control unit (an ECU) 100. The vehicle 1 is further equipped with motor-generators 71 and 72, an engine 73, a motive power division device 74, a drive shaft 75, and driving wheels 76, in addition to the secondary battery system 2.

Each of the motor-generators 71 and 72 is an AC rotating electrical machine, for example, a three-phase AC synchronous electric motor having a permanent magnet (not shown) embedded in a rotor. The motor-generator 71 is mainly used as a generator that is driven by the engine 73 via the motive power division device 74. An electric power generated by the motor-generator 71 is supplied to the motor-generator 72 or the battery 10 via the PCU 30.

The motor-generator 72 mainly operates as an electric motor, and drives the driving wheels 76. The motor-generator 72 is driven upon receiving at least one of the electric power from the battery 10 and the electric power generated by the motor-generator 71, and a driving force of the motor-generator 72 is transmitted to the drive shaft 75. On the other hand, when the vehicle is braked or decelerated on a downhill, the motor-generator 72 operates as a generator to execute regenerative electric power generation. An electric power generated by the motor-generator 72 is supplied to the battery 10 via the PCU 30.

The engine 73 is an internal combustion engine that outputs a motive power by converting combustion energy generated in burning an air-fuel mixture into kinetic energy of a moving piece (not shown) such as a piston, a rotor or the like.

The motive power division device 74 includes a planetary gear mechanism (not shown) having three rotary shafts, for example, a sun gear, a carrier, and a ring gear. The motive power division device 74 divides the motive power output from the engine 73 into a motive power for driving the motor-generator 71 and a motive power for driving the driving wheels 76.

The battery 10 is an assembled battery that is configured to include a plurality of cells. In the present embodiment, each of the cells is a lithium-ion secondary battery. It should be noted, however, that the battery 10 may be an assembled battery that is constituted of other secondary batteries such as nickel hydride batteries or the like. The battery 10 stores an electric power for storing the motor-generators 71 and 72, and supplies the electric power to the motor-generators 71 and 72 via the PCU 30. Besides, the battery 10 is charged upon receiving a generated electric power through the PCU 30 when the motor-generators 71 and 72 generate the electric power.

The monitoring unit 20 includes a voltage sensor 21, a current sensor 22, and a temperature sensor 23. The voltage sensor 21 detects a voltage VB of the battery 10. The current sensor 22 detects a current IB input/output to/from the battery 10. The temperature sensor 23 detects a temperature TB of the battery 10. Each of the sensors outputs a signal indicating a detection result thereof to the ECU 100. Incidentally, the configurations of the battery 10 and the monitoring unit 20 will be described in more detail with reference to FIG. 2.

The PCU 30 carries out bidirectional electric power conversion between the battery 10 and the motor-generators 71 and 72 in accordance with a control signal from the ECU 100. The PCU 30 is configured to be able to separately control the states of the motor-generators 71 and 72. For example, the PCU 30 can render the motor-generator 72 in a power running state while rendering the motor-generator 71 in a regenerative state (an electric power generation state). The PCU 30 is configured to include, for example, two inverters (not shown) that are provided in such a manner as to correspond to the motor-generators 71 and 72 respectively, and a converter (not shown) that steps up a DC voltage supplied to each of the inverters to a voltage equal to or higher than an output voltage of the battery 10.

The inlet 40 is configured such that a connector (not shown) of a charging cable can be connected thereto. The inlet 40 is supplied with an electric power from an external electric power supply 90 provided outside the vehicle 1, via the charging cable. The external electric power supply 90 is, for example, a commercial AC electric power supply. An electric power from the external electric power supply 90 is supplied to the charging device 50 via the inlet 40.

The charging device 50 converts the electric power supplied from the external electric power supply 90 via the inlet 40 into an electric power suited to charge the battery 10, in accordance with a control signal from the ECU 100. The charging device 50 is configured to, for example, an inverter (not shown) and a converter (not shown). The electric power subjected to electric power conversion by the charging device 50 is output between electric power lines PL and NL.

The air-conditioning device 60 carries out air-conditioning of a vehicle interior by heating or cooling the vehicle interior, in accordance with a control signal from the ECU 100. The air-conditioning device 60 is configured to include a compressor (not shown). The air-conditioning device 60 is electrically connected to the electric power lines PL and NL, and is driven by an electric power from the battery 10.

Incidentally, each of the PCU 30, the charging device 50, and the air-conditioning device 60 is an example of "the electric circuit" according to the present disclosure. More specifically, the charging device 50 is an example of "the electric power supply circuit" according to the present disclosure. Each of the PCU 30 and the air-conditioning device 60 is an example of "the load circuit" according to the present disclosure. It should be noted, however, that the PCU 30, the charging device 50, and the air-conditioning device 60 are all not indispensable to the secondary battery system 2. For example, the charging device 50 may not be provided, or the air-conditioning device 60 may not be provided. Besides, although not shown in the drawing, "the electric power supply circuit" may be a DC/DC converter that carries out electric power conversion between the battery 10 and an auxiliary battery.

The ECU 100 is configured to include a central processing unit (a CPU) 101, a memory (a read only memory (a ROM) and a random access memory (a RAM)) 102, and input/output ports (not shown) to/from which various signals are input/output. The ECU 100 executes various processes for controlling the vehicle 1 to a desired state, based on signals received from the respective sensors and a program and map stored in the memory 102.

Charge/discharge control of the battery 10 can be mentioned as main control that is executed by the ECU 100. In more concrete terms, the ECU 100, which controls the charge/discharge of the battery 10 by controlling the engine 73 and the PCU 30, can also discharge the battery 10 by controlling the air-conditioning device 60 or charge the battery 10 by controlling the charging device 50. Besides, the ECU 100 executes "a reaction resistance estimation process" for estimating a reaction resistance of the battery 10. The reaction resistance estimation process will be described later in detail.

Figure 2:
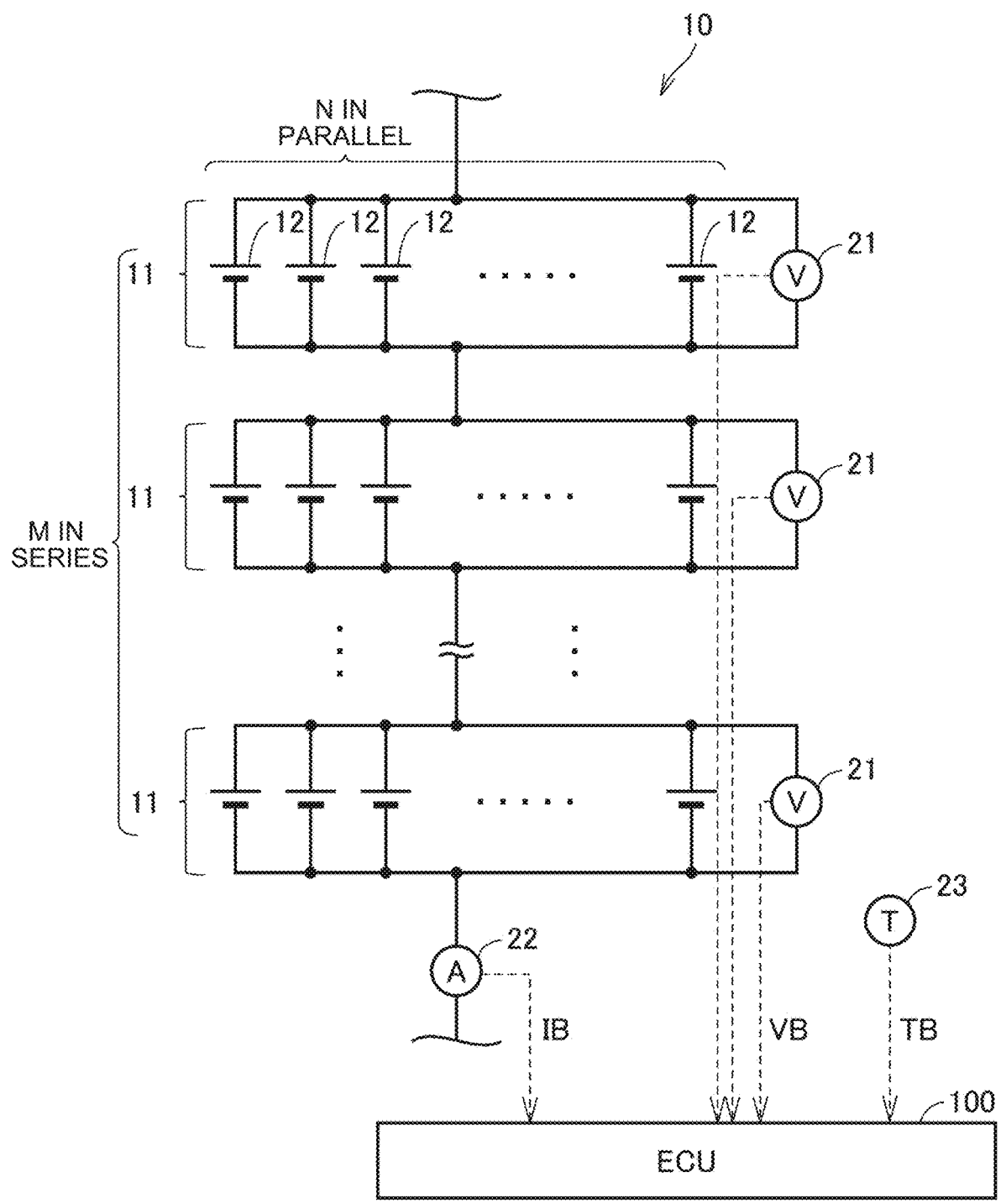
FIG. 2 is a view showing the configurations of a battery and a monitoring unit in more detail.

FIG. 2 is a view showing the configurations of the battery 10 and the monitoring unit 20 in more detail. Referring to FIGS. 1 and 2, the battery 10 includes, for example, M modules 11 that are connected in series to one another. Each of the modules 11 includes N cells 12 that are connected in parallel to one another. Each of M and N is a natural number equal to or larger than 2.

The voltage sensor 21 detects a voltage of each of the modules 11. The current sensor 22 detects a current IB flowing through all the modules 11. The temperature sensor 23 detects a temperature of the battery 10. It should be noted, however, that the voltage sensor 21 may not necessarily monitor each of the modules at a time, but may monitor each of the cells 12 or a plurality of adjacent ones of the cells 12 (the number of adjacent cells 12 is smaller than the total number of cells in each of the modules) at a time. Besides, the temperature sensor 23 is not required in particular to monitor a specific component or components at a time, and may detect a temperature of, for example, each of the modules (or each of the cells).

Figure 3:
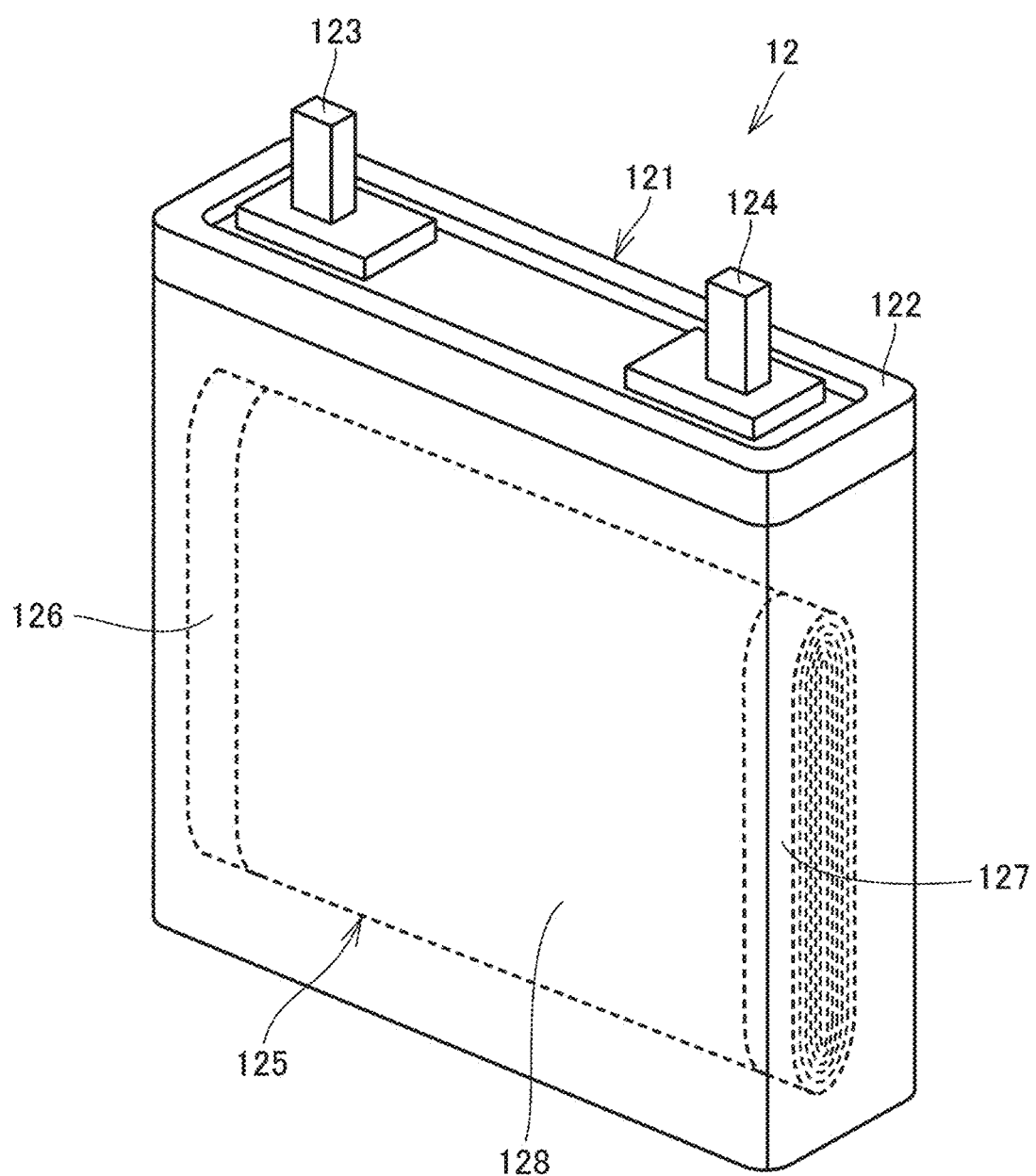
FIG. 3 is a view for illustrating the configuration of each of cells in more detail.

FIG. 3 is a view for illustrating the configuration of each of the cells 12 in more detail. The cell 12 in FIG. 3 is shown in such a manner that the interior thereof is transparent.

Referring to FIG. 3, the cell 12 has, for example, a rectangular battery case 121 (substantially in the shape of a rectangular parallelepiped). An upper surface of the battery case 121 is sealed by a lid body 122. One end of each of a positive electrode terminal 123 and a negative electrode terminal 124 protrudes outward from the lid body 122. The other ends of the positive electrode terminal 123 and the negative electrode terminal 124 are connected to an internal positive electrode terminal (not shown) and an internal negative electrode terminal (not shown) respectively inside the battery case 121. An electrode body 125 is accommodated inside the battery case 121. The electrode body 125 is formed by laminating a positive electrode 126 and a negative electrode 127 on each other via a separator 128 and winding a lamination body thereof. An electrolytic solution is retained by the positive electrode 126, the negative electrode 127, the separator 128 and the like.

Conventionally known configurations and materials can be used for the positive electrode 126, the negative electrode 127, the separator 128, and the electrolytic solution, as a positive electrode, a negative electrode, a separator, and an electrolytic solution of a lithium-ion secondary battery, respectively. For example, a ternary material with part of lithium cobalt oxide replaced with nickel and manganese can be used for the positive electrode 126. For example, carbon (graphite) or a silicon material can be used for the negative electrode 127. Polyolefin (e.g., polyethylene or polypropylene) can be used for the separator 128. The electrolytic solution contains an organic solvent (e.g., a mixed solvent of dimethyl carbonate (DMC), ethyl methyl carbonate (EMC), and ethylene carbonate (EC)), a lithium salt (e.g., $LiPF_6$), an additive (e.g., lithium bis (oxalate) borate (LiBOB) or $Li[PF_2(C_2O_4)_2]$) and the like.

Incidentally, the internal configuration of the battery 10, the cell configuration, and the unit to be monitored by the monitoring unit 20 at a time are all nothing but exemplifications, and are not limited in particular. Accordingly, the comprehensive name "the battery 10" will be simply used hereinafter instead of distinguishing the plurality of the modules 11 from one another or distinguishing the plurality of the cells 12 from one another.

Figure 4:
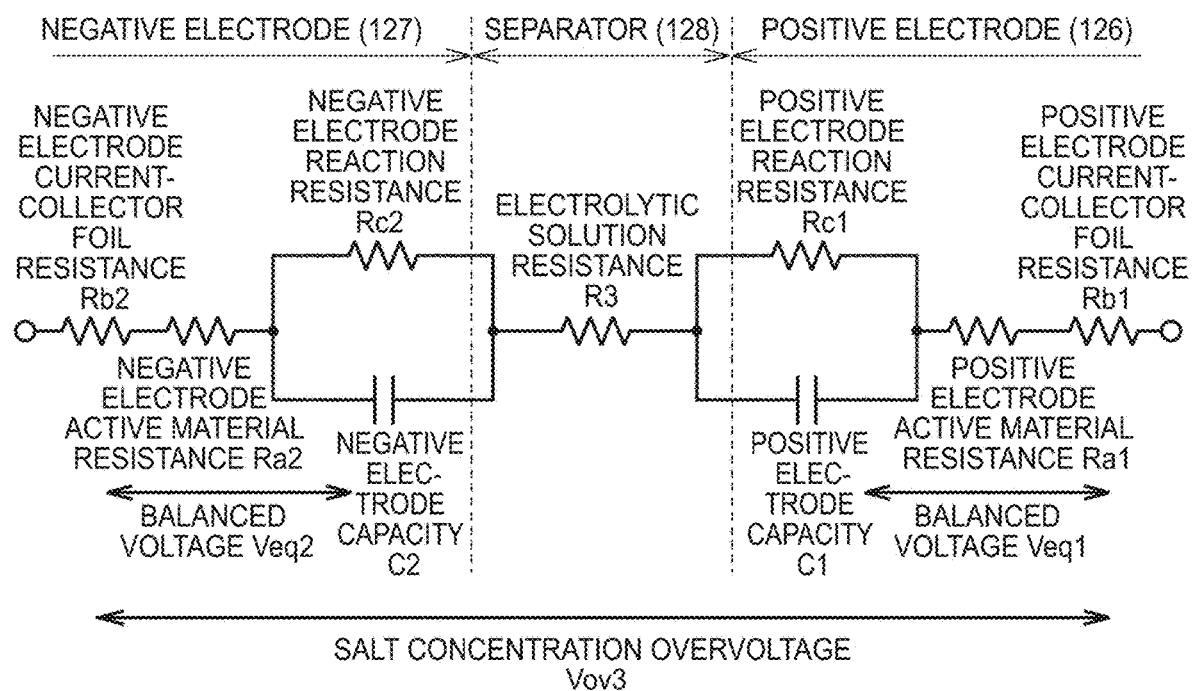
FIG. 4 is a view for illustrating an impedance component of the battery.

The battery 10 configured as described above includes various impedance components. FIG. 4 is a view for illustrating the impedance components of the battery 10. FIG. 4 shows an exemplary equivalent circuit diagram of the positive electrode 126, the negative electrode 127, and the separator 128 of the battery 10 (more specifically, each of the cells 12). In general, the impedance components of the secondary battery are broadly classified into a DC resistance Rdc, a reaction resistance Rc, and a diffusion resistance Rd.

The DC resistance Rdc is an impedance component associated with the movement of ions and electrons between the positive electrode and the negative electrode. The DC resistance Rdc increases due to a bias in the distribution of concentration of salt in the electrolytic solution in the case where a high load is applied to the secondary battery (in the case where a high voltage is applied thereto or a large current flows therethrough). In the equivalent circuit diagram shown in FIG. 4, the DC resistance Rdc is expressed as a positive electrode active material resistance Ra1, a negative electrode active material resistance Ra2, a positive electrode current-collector foil resistance Rb1, a negative electrode current-collector foil resistance Rb2, and an electrolytic solution resistance R3 of the separator.

The reaction resistance Rc is an impedance component associated with the exchange of electric charges (the movement of electric charges) on an interface between the electrolytic solution and an active material interface (the surface of a positive electrode active material and a negative electrode active material). The reaction resistance Rc increases through the growth of a coat or the like on the interface between the active material and the electrolytic solution in the case where the secondary battery in a high SOC state is under a high-temperature environment. In the equivalent circuit diagram, the reaction resistance Rc is expressed as a positive electrode reaction resistance Rc1 and a negative electrode reaction resistance Rc2.

The diffusion resistance Rd is an impedance component associated with the diffusion of salt in the electrolytic solution or the diffusion of an electric charge transport material in the active material. The diffusion resistance Rd increases due to the breaking of the active material at the time of application of a high load thereto. The diffusion resistance Rd is determined from a balanced voltage Veq1 that is generated at the positive electrode, a balanced voltage Veq2 that is generated at the negative electrode, and a salt concentration overvoltage Vov3 (an overvoltage resulting from the production of a distribution of the concentration of salt in the active material in the separator) that is generated in each of the cells.

Various impedance components are included in an impedance Z of the battery 10 as described above. As a result, the time of response to changes in the current IB differs depending on each of the impedance components. The impedance component with a relatively short response time can follow changes in the current IB on a short cycle (i.e., a high frequency). On the other hand, the impedance component with a relatively long response time cannot follow changes in the current IB on the short cycle.

Based on this knowledge, in the present embodiment, the current IB of the battery 10 is fluctuated on different cycles by, for example, controlling the charging device 50, and a current pattern with a ripple component superimposed on a constant current is generated. Then, a voltage response (the voltage VB) at the time of application of this current pattern is detected by the voltage sensor 21.

Figure 5A:
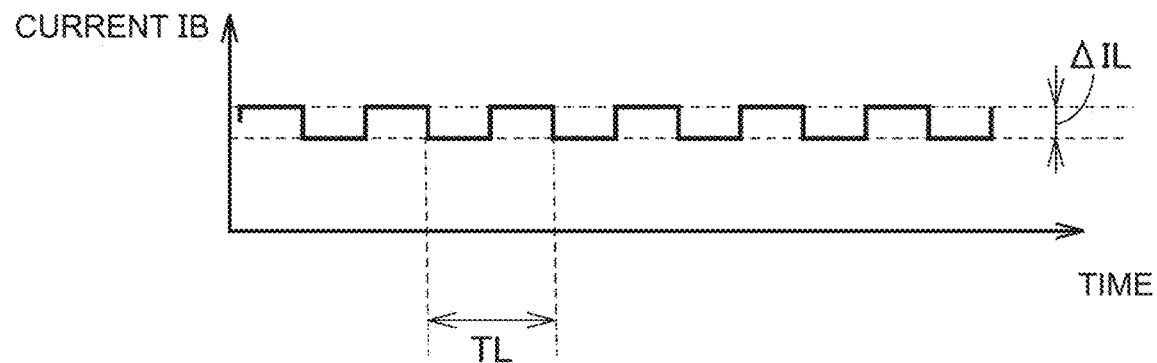
FIG. 5A is a view showing an exemplary current pattern on a long cycle in the present embodiment.
Figure 5B:
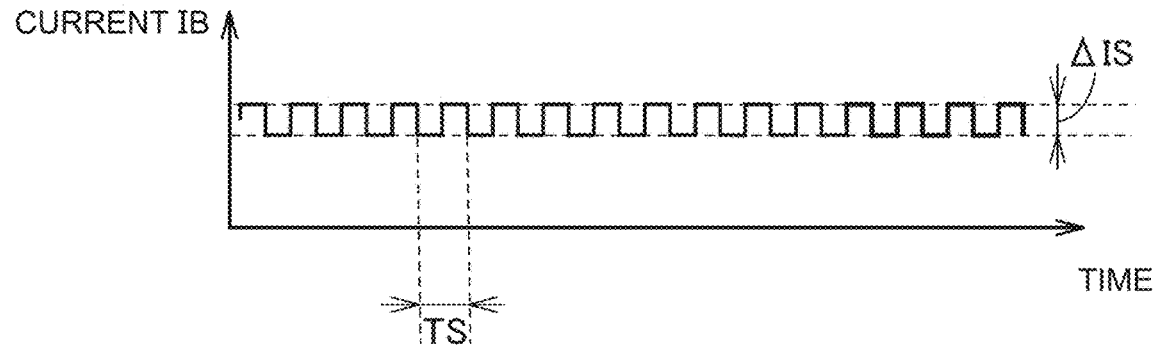
FIG. 5B is a view showing an exemplary current pattern on a short cycle in the present embodiment.

Each of FIGS. 5A and 5B is a view showing an exemplary current pattern in the present embodiment. In each of FIGS. 5A and 5B, the axis of abscissa represents elapsed time, and the axis of ordinate represents the current IB. Parameters at the time of application of the current pattern on the long cycle will be accompanied hereinafter by "L", and parameters at the time of application of the current pattern on the short cycle will be accompanied hereinafter by "S". FIG. 5A shows a current pattern on a long cycle TL, and FIG. 5B shows a current pattern on a short cycle TS.

When a current fluctuation width with reference to a current value of the constant current (a base current) (a fluctuation width of the current IB during application of the current pattern on the long cycle TL or the short cycle TS) is denoted by $\Delta I$ and a voltage fluctuation width resulting from fluctuations in the current (a fluctuation width of the voltage VB during one cycle) is denoted by $\Delta V$, there is established a relationship of an equation (1) shown below among $\Delta V$, $\Delta I$, and the impedance Z.

$$\Delta V = \Delta OCV - Z \Delta I \quad (1)$$

In the equation (1), an open circuit voltage (OCV) fluctuation width resulting from fluctuations in the current is denoted by $\Delta OCV$. In the equation (1), when the cycle is sufficiently short, $\Delta OCV$ can be regarded as being approximately equal to 0. Accordingly, the impedance Z can be calculated from a ratio between the voltage fluctuation width $\Delta V$ and the current fluctuation width $\Delta I$ as indicated by an equation (2) shown below.

$$Z = -\Delta V / \Delta I \quad (2)$$

In the present embodiment, the current patterns on the long cycle TL and the short cycle TS are applied to the battery 10, and the impedance is calculated by detecting the voltage fluctuation width $\Delta I$ at that time. The impedance that is calculated in the case where the current pattern is on the long cycle TL will be referred to as "a long-cycle impedance ZL". The impedance that is calculated in the case where the current pattern is on the short cycle TS will be referred to as "a short-cycle impedance ZS".

Various methods can be adopted as a method of generating the current pattern. In concrete terms, the ECU 100 can control the PCU 30 such that a d-axis current (a current that does not serve as a torque) of the motor-generator 72 fluctuates when the vehicle 1 steadily runs (when the vehicle 1 runs at a constant speed). Besides, as described previously, the ECU 100 may control the charging device 50 such that the charging current flowing to the battery 10 fluctuates through electric power conversion by the charging device 50 at the time of external charging. Alternatively, the ECU 100 may fluctuate the consumption current of a compressor (not shown) of the air-conditioning device 60 when the vehicle 1 steadily runs or is externally charged.

Incidentally, each of FIGS. 5A and 5B shows an example in which a current pattern of rectangular waves is applied, but the waveform of the current pattern is not limited thereto. The current pattern may have a sinusoidal or saw-toothed waveform. Alternatively, the current pattern may have a waveform obtained by appropriately synthesizing rectangular waves, sinusoidal waves, and saw-toothed waves.

It is preferable to determine the values of the long cycle TL and the short cycle TS in advance by subjecting the battery 10 to an AC impedance measurement as will be mentioned below.

Figure 6:
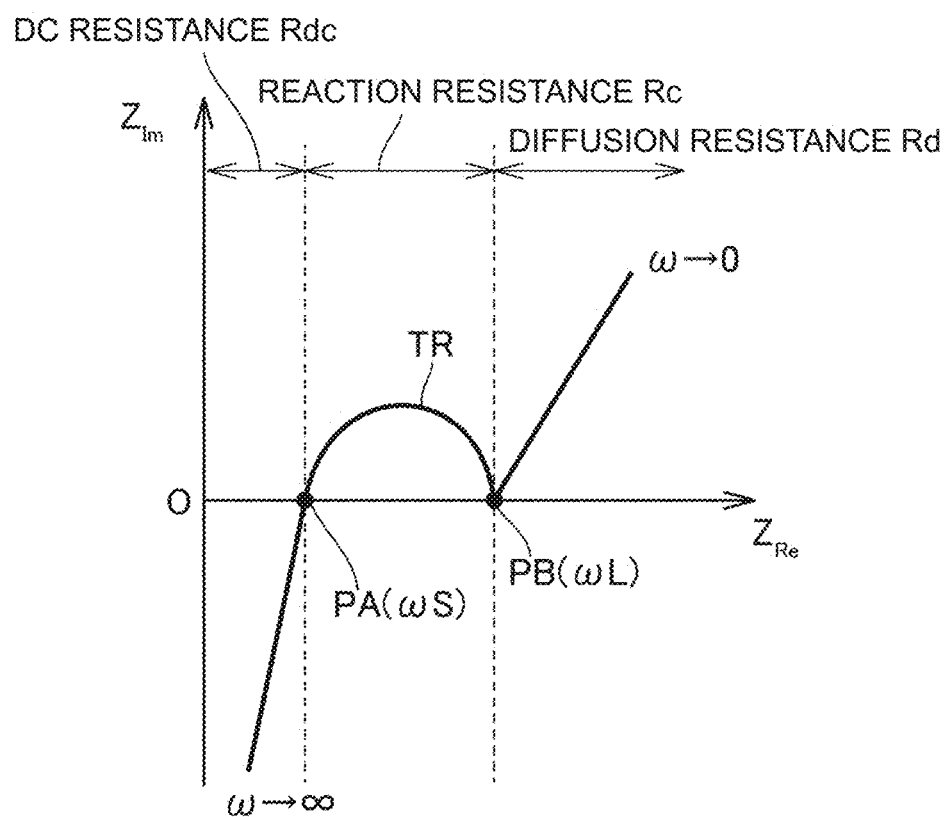
FIG. 6 is a complex impedance plot (a Nyquist plot) of an AC impedance measurement result for determining the long cycle and the short cycle.

FIG. 6 is a complex impedance plot (which is also referred to as a Nyquist plot) of a result of the AC impedance measurement for determining the long cycle TL and the short cycle TS. In FIG. 6, the axis of abscissa represents a real number component $Z_{Re}$ (a resistance component) of a complex impedance, and the axis of ordinate represents an imaginary number component $Z_{Im}$ (a capacity component) of the complex impedance.

In the AC impedance measurement, an angular frequency $\omega$ is swept within a range of, for example, 10 mHz to 100 kHz. A plot at a lower-left end of the drawing (indicated by $\omega \to \infty$) represents an AC impedance measurement value in the case where the angular frequency $\omega$ is the lowest (e.g., 10 mHz). A plot at an upper-right end of the drawing (indicated by $\omega \to 0$) represents an AC impedance measurement value in the case where the angular frequency $\omega$ is the highest (e.g., 100 kHz).

A semicircular trajectory (denoted by TR) emerges in a frequency range between these angular frequencies w. The DC resistance Rdc is reflected on a lower frequency side than a low frequency-side end point (denoted by PA) of the trajectory TR. On the other hand, the diffusion resistance Rd is reflected on a higher frequency side than a high frequency-side end point (denoted by PB) of the trajectory TR. The reaction resistance Rc is reflected on the trajectory TR between the end point PA and the end point PB.

The short cycle TS can be obtained as a cycle ($=2\pi/\omega S$) corresponding to the angular frequency $\omega S$ at the end point PA. On the other hand, the long cycle TL can be obtained as a cycle ($=2\pi/\omega L$) corresponding to the angular frequency $\omega L$ at the end point PB. The long cycle TL is a cycle in the order of, for example, about several seconds (i.e., a cycle corresponding to a frequency range of about 1 Hz). The short cycle TS is a cycle shorter than the order of, for example, milliseconds (a cycle corresponding to a frequency range that is higher than 1 kHz).

Incidentally, in general, the measurement value of the AC impedance can change in accordance with the temperature and SOC of the secondary battery. Accordingly, it is desirable to execute the AC impedance measurement as described with reference to FIG. 6 under various conditions, and prepare in advance a map (which may be a function) that prescribes a relationship between the temperature TB and SOC of the battery 10. By referring to this map, the long cycle TL can be obtained from the temperature TB and SOC of the battery 10. The same holds true for the short cycle TS.

In the present embodiment, the long-cycle impedance ZL and the short-cycle impedance ZS are sequentially calculated (it should be noted, however, that they may be calculated in any sequence), and a difference $\Delta Z = ZL - ZS$ between the long-cycle impedance ZL and the short-cycle impedance ZS is calculated. As will be understood from the following description, this difference $\Delta Z$ is an impedance component corresponding to the reaction resistance Rc of the battery 10.

Figure 7A:
FIG. 7A is a view showing an equivalent circuit of the battery on the long cycle.
Figure 7B:
FIG. 7B is a view showing an equivalent circuit of the battery on the short cycle.
Figure 7C:
FIG. 7C is a view showing a difference between the equivalent circuit of the battery on the long cycle and the equivalent circuit of the battery on the short cycle.

Each of FIGS. 7A, 7B, and 7C is a view showing an equivalent circuit of the battery 10 on the long cycle TL and the short cycle TS. FIG. 7A shows an equivalent circuit diagram on the long cycle TL, and FIG. 7B shows an equivalent circuit diagram on the short cycle TS.

Even the impedance component with a relatively long response time can follow changes in the current pattern on the long cycle TL. Therefore, the long-cycle impedance ZL includes all the impedance components. That is, as shown in FIG. 7A, the long-cycle impedance ZL includes active material resistances Ra (the positive electrode active material resistance Ra1 and the negative electrode active material resistance Ra2), current-collector foil resistances Rb (the positive electrode current-collector foil resistance Rb1 and the negative electrode current-collector foil resistance Rb2), and reaction resistances Rc (the positive electrode reaction resistance Rc1 and the negative electrode reaction resistance Rc2), and the electrolytic solution resistance R3.

In contrast, the impedance component with a relatively long response time cannot follow changes in the current pattern on the short cycle TS. More detailed description will follow. The equivalent circuit diagram shown in FIG. 4 shows a positive electrode capacity C1 that is connected in parallel to the positive electrode reaction resistance Rc1, and a negative electrode capacity C2 that is connected in parallel to the negative electrode reaction resistance Rc2. When the current fluctuates (when the current increases or decreases), the fluctuating current flows through the capacities C1 and C2 (an electric double layer) and hence does not flow to any one of the reaction resistances Rc. Therefore, the voltage fluctuation width $\Delta V$ does not include a component resulting from the reaction resistance Rc (the positive electrode reaction resistance Rc1 or the negative electrode reaction resistance Rc2). Therefore, as shown in FIG. 7B, the short-cycle impedance ZS includes the active material resistances Ra and the current-collector foil resistances Rb, but does not include the reaction resistance Rc.

Accordingly, the reaction resistance Rc can be obtained from the difference $\Delta Z$ between the long-cycle impedance ZL and the short-cycle impedance ZS (see FIG. 7C). By obtaining the reaction resistance Rc, the degree of progress of deposition of lithium in the battery 10 (or the degree of change in tolerability against the deposition of lithium in the battery 10) can be accurately estimated as described previously.

Incidentally, the short-cycle impedance ZS includes the active material resistances Ra, the current-collector foil resistances Rb, and the electrolytic solution resistance R3 (see FIG. 7B). The active material resistances Ra and the current-collector foil resistances Rb are unlikely to increase even when the battery 10 deteriorates. Therefore, the amount of increase in the short-cycle impedance ZS mainly indicates the amount of increase in the electrolytic solution resistance R3. In general, the electrolytic solution resistance in the lithium-ion secondary battery often increases due to a deterioration (a so-called high-rate deterioration) resulting from a bias in the concentration of lithium ions in the electrolytic solution. In consequence, the degree of progress of the high-rate deterioration can be estimated with high accuracy by obtaining the amount of increase in the short-cycle impedance ZS.

On the other hand, the long-cycle impedance ZL includes all the impedance components, so the parameters for controlling the charge/discharge electric power of the battery 10 can be calculated from the long-cycle impedance ZL. In concrete terms, a charge permissible electric power Win indicating a control upper limit of the charge electric power of the battery 10 and a charge permissible electric power indicating a control lower limit of the charge electric power of the battery 10 can be accurately calculated from the long-cycle impedance ZL.

It should be noted herein that the inventors have focused attention on the fact that the reaction resistance Rc cannot be accurately carved up from the other impedance components through the use of the dependency on the cycle of the current pattern when a condition that will be described later is satisfied in obtaining the reaction resistance Rc, and that the accuracy in estimating the reaction resistance Rc can fall. More detailed description will follow. The current pattern is generated through the control of the PCU 30, the charging device 50, or the air-conditioning device 60 as described previously. However, various factors may make it impossible to generate a desired (or targeted) current pattern. For example, while the PCU 30 is controlled such that the d-axis current fluctuates during steady running of the vehicle 1, steady running cannot be maintained in a certain running situation of the vehicle 1, and as a result, the pattern of the d-axis current may become disorderly, or a q-axis current may flow. In this case, the accuracy in estimating the reaction resistance Rc can fall. When the accuracy in estimating the reaction resistance Rc falls, high-accuracy estimation of the degree of change in tolerability against the deposition of lithium can also become impossible. That is, the accuracy in estimating the deterioration state of the battery 10 may fall.

Thus, in the present embodiment, "a reaction resistance estimation process" for estimating the reaction resistance Rc when a condition including first to fourth conditions that will be described later is satisfied is executed.

Figure 8:
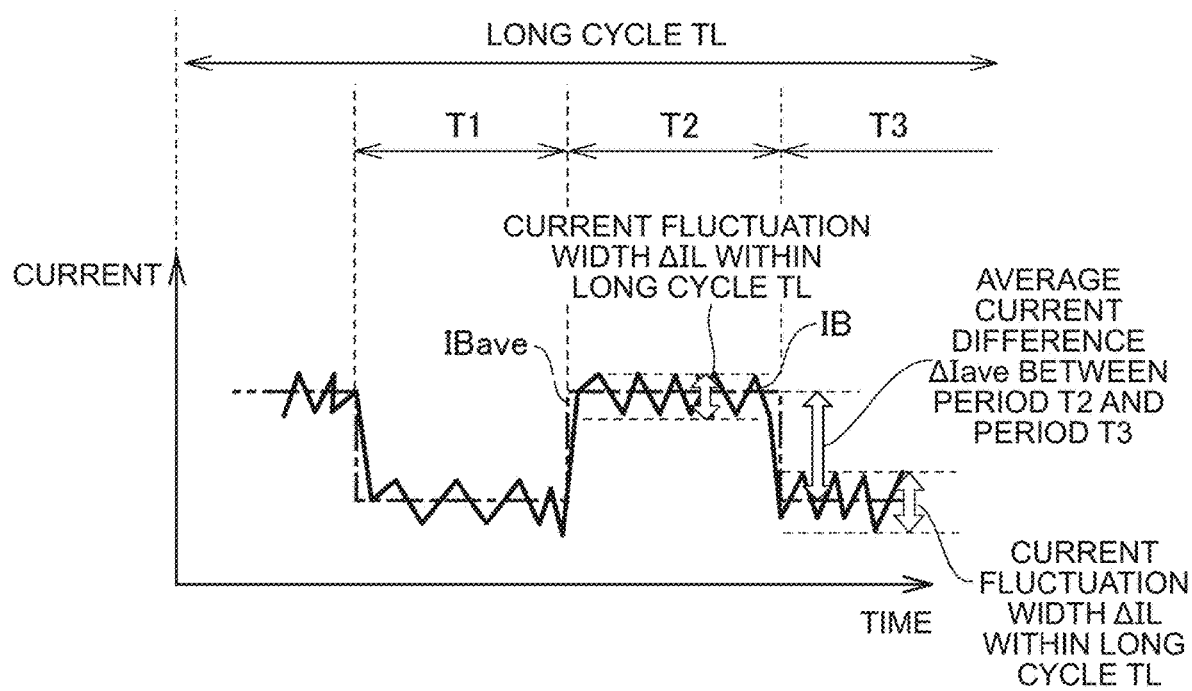
FIG. 8 is a view for illustrating first to fourth conditions.

FIG. 8 is a view for illustrating the first to fourth conditions. In FIG. 8, the axis of abscissa represents the elapsed time at the time of application of the current pattern, and the axis of ordinate represents the current flowing through the battery 10. In FIG. 8, the current IB actually flowing through the battery 10 (a current on which a ripple is superimposed) is indicated by a solid line, and an average current IBave is indicated by an alternate long and short dash line.

An example in which the reaction resistance estimation process is executed in changing the current pattern on the long cycle TL will be described with reference to FIG. 8. As shown in FIG. 8, an average of the current IB (an average current) is calculated at intervals of a predetermined period while applying the current pattern on the long cycle TL to the battery 10. Examples of periods T1 to T3 are depicted in FIG. 8. A difference between an average current during a certain period and an average current during a subsequent period is referred to as "a drop $\Delta$IaveL". In FIG. 8, the drop ($\Delta$IaveL) between the average current during the period T2 and the average current during the period T3 is shown as an example. On the other hand, a target drop $\Delta$ItagL as a target value is determined in advance for the drop.

The first condition is a condition that the difference between the drop $\Delta$IaveL and the target drop $\Delta$ItagL (more specifically, the absolute value of the difference |$\Delta$IaveL−$\Delta$ItagL|) is equal to or smaller than a first reference value REF1. The third condition is a condition that a current fluctuation width $\Delta$IL during each period on the long cycle TL is equal to or smaller than a reference value REF3.

Incidentally, although not described in detail, the same holds true in the case of the short cycle. As the second condition, it is determined whether or not a condition that the difference between the drop $\Delta$IaveS and the target drop $\Delta$ItagS (=$\Delta$IaveS−$\Delta$ItagS|) is equal to or smaller than a second reference value REF2 is satisfied. Besides, as the fourth condition, it is determined whether or not a condition that the current fluctuation width $\Delta$IS during each period on the short cycle TS is equal to or smaller than a fourth reference value REF4 is satisfied.

When at least one of the first condition and the second condition is not satisfied, for example, the running situation of the vehicle 1 may have changed (the vehicle 1 may have stopped running steadily) or the charge electric power from outside the vehicle 1 may have fluctuated while the current pattern is applied. Besides, when at least one of the third condition and the fourth condition is not satisfied, noise as well as the intended ripple may be superimposed on the constant current.

In contrast, when the first to fourth conditions are all satisfied, the above-mentioned situation has not arisen, and it is safe to conclude that an ideal current pattern has been generated. Accordingly, the accuracy in estimating the reaction resistance Rc calculated through application of such a current pattern is also sufficiently high, and hence the accuracy in estimating the deterioration state of the battery 10 can be enhanced.

Figure 9:
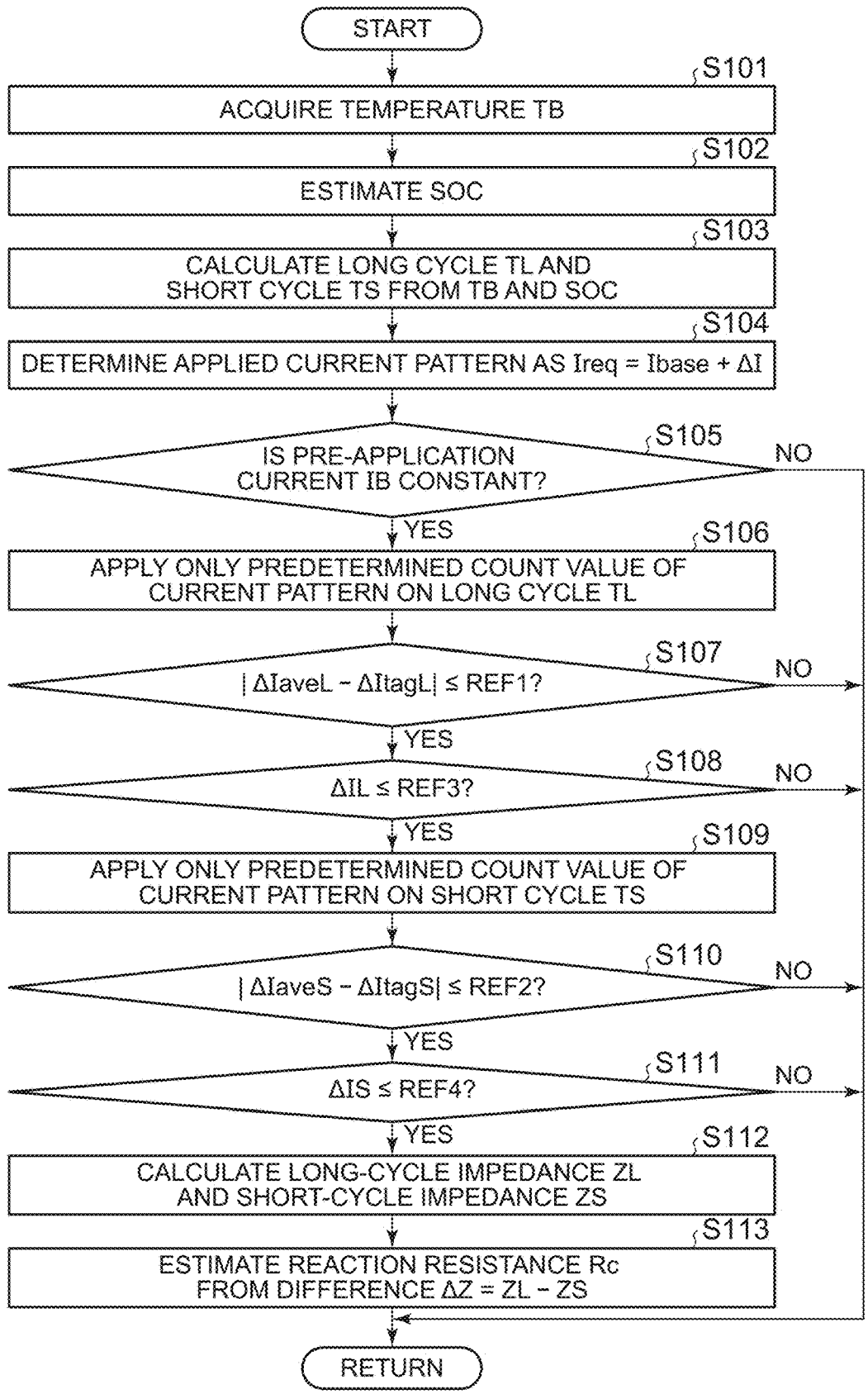
FIG. 9 is a flowchart for illustrating a reaction resistance estimation process of the battery in the present embodiment.

FIG. 9 is a flowchart for illustrating the reaction resistance estimation process of the battery 10 in the present embodiment. This flowchart is called out from a main routine (not shown) and carried out at intervals of a predetermined cycle, when a condition that enables application of the current pattern (more specifically, a condition that enables the control of the PCU 30, the charging device 50, or the air-conditioning device 60 as described previously at the time of steady running, external charging or the like) is satisfied. Each step (which will be abbreviated as S) is basically realized through a software process by the ECU 100, but may be realized through a hardware process by an electronic circuit prepared in the ECU 100.

Referring to FIG. 9, in S101, the ECU 100 acquires the temperature TB of the battery 10 from the temperature sensor 23. Furthermore, the ECU 100 estimates an SOC of the battery 10 (S102). Various known methods such as a method in which an OCV curve (an OCV-SOC curve) is referred to, a method based on current integration, and the like can be used as a method of estimating the SOC.

In S103, the ECU 100 calculates the long cycle TL and the short cycle TS from the temperature TB and SOC of the battery 10 by referring to a map (not shown) stored in advance in the memory 102. The method of calculating these cycles has been described in detail with reference to FIG. 6, so the description thereof will not be repeated herein.

In S104, the ECU 100 determines a current pattern (an application required current) applied to the battery 10. The application required current is calculated by adding a predetermined amplitude to a certain base current.

In S105, the ECU 100 determines whether or not the current IB flowing through the battery 10 before application of the current pattern determined in S104 is constant. This condition is equivalent to "the fifth condition" according to the present disclosure.

If the current IB before application of the current pattern (i.e., before superimposition of the ripple) is not constant (NO in S105), namely, if the ripple has already been superimposed on the current IB before application, the accuracy in estimating the reaction resistance Rc can become low due to the influence of such an unintended ripple. Accordingly, the ECU 100 skips the following processing steps, and returns the process to the main routine. If the current IB before application is constant and no ripple has been superimposed thereon (YES in S105), the ECU 100 advances the process to S106.

In S106, the ECU 100 applies only a predetermined count value (the number of repetitions of a current waveform) of the current pattern on the long cycle TL to the battery 10. Then, the ECU 100 acquires the voltage VB and current IB of the battery 10 during application of the current pattern from the voltage sensor 21 and the current sensor 22, respectively.

In S107 and S108, the ECU 100 determines whether or not the condition that the difference between the drop $\Delta$IaveL on the long cycle TL and the target drop $\Delta$ItagL (=|$\Delta$IaveL−$\Delta$ItagL|) is equal to or smaller than the first reference value REF1 (the first condition) is satisfied. Besides, the ECU 100 determines whether or not the condition that the current fluctuation width $\Delta$IL during each period on the long cycle TL is equal to or smaller than the third reference value REF3 (the third condition) is satisfied.

If even one of the first condition and the third condition is not satisfied (NO in at least one of S107 and S108), the ECU 100 skips the following processing steps and returns the process to the main routine.

If both the first condition and the third condition are satisfied (YES in both S107 and S108), the ECU 100 advances the process to S109. In S109, the ECU 100 applies only the predetermined count value of the current pattern on the short cycle TS to the battery 10, and acquires the voltage VB and current IB of the battery 10 at that time from the voltage sensor 21 and the current sensor 22, respectively.

In S110 and S111, the ECU 100 determines whether or not the condition that the difference between the drop ΔIaveS on the short cycle TS and the target drop ΔItagS (=|ΔIaveS−ΔItagS|) is equal to or smaller than the second reference value REF2 (the second condition) is satisfied. Besides, the ECU 100 determines whether or not the condition that the current fluctuation width ΔIS during each period on the short cycle TS is equal to or smaller than the fourth reference value REF4 (the fourth condition) is satisfied.

If even one of the second condition and the fourth condition is not satisfied (NO in at least one of S111 and S112), the ECU 100 skips the following processing steps and returns the process to the main routine. If both the second condition and the fourth condition are satisfied (YES in both S111 and S112), the ECU 100 advances the process to S112.

In S112, the ECU 100 calculates the long-cycle impedance ZL from detection results of the voltage VB and the current IB at the time of application of the current pattern on the long cycle TL. Besides, the ECU 100 calculates the short-cycle impedance ZS from detection results of the voltage VB and the current IB at the time of application of the current pattern on the short cycle TS. Then, the ECU 100 estimates the reaction resistance Rc of the battery 10 by calculating a difference ΔZ between the long-cycle impedance ZL and the short-cycle impedance ZS (S113).

If the first condition is not satisfied, the running situation of the vehicle 1 may have changed at the time of application of the current pattern on the long cycle TL. By the same token, if the second condition is not satisfied, the running situation of the vehicle 1 may have changed at the time of application of the current pattern on the short cycle TS. In this case, the long-cycle impedance ZL and the short-cycle impedance ZS have not been calculated under the same condition, so the accuracy in estimating the reaction resistance Rc may also become low.

Besides, if at least one of the third condition and the fourth condition is not satisfied, the current pattern according to the application required current determined in S104 may not have been generated due to various factors such as disturbance noise from outside the vehicle 1 and the like.

In contrast, according to the present embodiment, when the first to fourth conditions are all satisfied, the reaction resistance Rc of the battery 10 is estimated. In this manner, the degree of change in tolerability against the deposition of lithium can also be estimated with high accuracy through the use of the reaction resistance Rc estimated with high accuracy. That is, the accuracy in estimating the deterioration state of the battery 10 can be enhanced.

Incidentally, as a condition for executing the reaction resistance estimation process, it is desirable that the first to fourth conditions be all satisfied, but the fulfillment of all these conditions is not indispensable. If the first condition and the second condition are satisfied, the reaction resistance estimation process may be executed even when the third condition and the fourth condition are not satisfied, although the accuracy in estimating the reaction resistance can become lower than in the case where the first to fourth conditions are all satisfied.

The embodiment disclosed herein should be considered to be exemplary in every respect and non-restrictive. The scope of the present disclosure is defined not by the foregoing description of the embodiment but by the claims. The present disclosure is intended to encompass all the alterations that are equivalent in significance and scope to the claims.

What is claimed is:

1. A secondary battery system comprising:
   a secondary battery including an electrode, the electrode including an active material and impregnated with an electrolytic solution;
   an electric circuit including at least one of an electric power supply circuit that is configured to supply an electric power to the secondary battery, and a load circuit that is configured to consume the electric power of the secondary battery; and
   an electronic control unit configured to control an input current input to the secondary battery and an output current output from the secondary battery by controlling the electric circuit,
   the electronic control unit configured to execute first calculation control, second calculation control, and estimation control when a predetermined condition including a first condition and a second condition is satisfied,
   the first calculation control being control for calculating a first impedance of the secondary battery based on a voltage value of the secondary battery at a time when a current value of the secondary battery is fluctuated on a first cycle,
   the second calculation control being control for calculating a second impedance of the secondary battery based on the voltage value of the secondary battery at a time when the current value of the secondary battery is fluctuated on a second cycle that is shorter than the first cycle,
   the estimation control being control for estimating a reaction resistance of the secondary battery from a difference between the first impedance and the second impedance, the reaction resistance being an impedance component that is associated with exchange of an electric charge on an interface between the electrolytic solution and the active material,
   the first condition being a condition that a difference between an average current difference of the secondary battery and a first target current difference determined in advance is smaller than a first reference value when the current is fluctuated on the first cycle, and
   the second condition being a condition that a difference between the average current difference of the secondary battery and a second target current difference determined in advance is smaller than a second reference value when the current is fluctuated on the second cycle, the average current difference being a difference between an average current value of the secondary battery within a predetermined period and an average current value of the secondary battery within a period subsequent to the predetermined period.

2. The secondary battery system according to claim 1, wherein
   the predetermined condition includes a third condition and a fourth condition, the third condition being a condition that a fluctuation width of the current value of the secondary battery on the first cycle is smaller than a third reference value, and the fourth condition being a condition that the fluctuation width of the current value of the secondary battery on the second cycle is smaller than a fourth reference value.

3. The secondary battery system according to claim 2, wherein
the predetermined condition includes a fifth condition, the fifth condition being a condition that the fluctuation width of the current value of the secondary battery before fluctuation of the current value of the secondary battery on either the first cycle or the second cycle is smaller than a fifth reference value.

4. The secondary battery system according to claim 1, wherein
the secondary battery, the electric circuit, and the electronic control unit are mounted on a vehicle,
the electric power supply circuit includes a charging device that is configured to charge the secondary battery with the electric power supplied from outside the vehicle.

5. The secondary battery system according to claim 1, wherein
the secondary battery, the electric circuit, and the electronic control unit are mounted on a vehicle,
the load circuit includes at least one of a drive device that is configured to drive a motor-generator of the vehicle, and an air-conditioning device that is configured to execute air-conditioning of a vehicle interior of the vehicle.

6. A method of estimating a deterioration state of a secondary battery system,
the secondary battery system including a secondary battery and an electronic control unit that is configured to control an input current input to the secondary battery an output current output from the secondary battery,
the method of estimating the deterioration state comprising:
executing, by the electronic control unit, a first calculation step, a second calculation step, and an estimation step when a predetermined condition including a first condition and a second condition is satisfied,
the first calculation step being a step of calculating a first impedance of the secondary battery based on a voltage value of the secondary battery at a time when a current value of the secondary battery is fluctuated on a first cycle,
the second calculation step being a step of calculating a second impedance of the secondary battery based on the voltage value of the secondary battery at a time when the current value of the secondary battery is fluctuated on a second cycle that is shorter than the first cycle,
the estimation step being a step of estimating a reaction resistance of the secondary battery from a difference between the first impedance and the second impedance, the reaction resistance being an impedance component that is associated with exchange of an electric charge on an interface between an electrolytic solution and an active material of the secondary battery,
the first condition being a condition that a difference between an average current difference of the secondary battery and a first target current difference determined in advance is smaller than a first reference value when the current is fluctuated on the first cycle, and
the second condition being a condition that a difference between the average current difference of the secondary battery and a second target current difference determined in advance is smaller than a second reference value when the current is fluctuated on the second cycle, the average current difference being a difference between an average current value of the secondary battery within a predetermined period and an average current value of the secondary battery within a period subsequent to the predetermined period.

* * * * *